United States Patent [19]
Matsui et al.

[11] 4,351,856
[45] Sep. 28, 1982

[54] SEMICONDUCTOR DEVICE AND METHOD OF MANUFACTURING THE SAME

[75] Inventors: Makoto Matsui, Kunitachi; Yasuhiro Shiraki, Hino; Yoshifumi Katayama, Tokorozawa; Toshihisa Tsukada, Sekimachi; Eiichi Maruyama, Kodaira, all of Japan

[73] Assignee: Hitachi, Ltd., Tokyo, Japan

[21] Appl. No.: 170,185

[22] Filed: Jul. 18, 1980

[30] Foreign Application Priority Data

Jul. 20, 1979 [JP] Japan .................................. 54-91566

[51] Int. Cl.$^3$ .......................... B05D 3/06; B05D 5/12; B32B 17/06
[52] U.S. Cl. ......................................... 427/38; 427/85; 427/82; 427/86; 427/95; 428/428; 428/448; 428/469; 148/174; 148/175; 148/186; 148/188; 357/49; 357/50
[58] Field of Search ............... 428/428, 448, 469, 448; 427/255, 82, 85, 86, 38, 255.3, 95, 255.7; 148/49, 50

[56] References Cited

U.S. PATENT DOCUMENTS

| | | | |
|---|---|---|---|
| 3,082,124 | 3/1963 | French et al. | 427/255 X |
| 3,463,667 | 8/1969 | Chupra | 428/428 |
| 3,794,516 | 2/1974 | Engeler et al. | 427/255 X |
| 3,892,608 | 7/1975 | Kuhn | 427/255 X |
| 4,179,528 | 12/1979 | Losee et al. | 427/86 X |
| 4,237,151 | 12/1980 | Strongin et al. | 427/95 |

OTHER PUBLICATIONS

Gorohov et al., "Characteristics of Polycrystalline Silicon Integrated Circuits", Thin Solid Films, vol. 35, No. 2, Jun. 1976, pp. 149-153.
"New Process Developed for Silicon-IC Substrate Production," Electrical Design News, vol. 18, No. 3, Jul. 5, 1973, pp. 30-31.
Neudeck et al., "Theory and Interpretation of the Field-Effect Conductance Experiment in Amorphous Silicon," J. Applied Physics, vol. 46, No. 6, Jun. 1975, pp. 2662-2669.
Barson, "Double-Diffused MOS Device and Process of Fabricating," IBM Technical Disclosure Bulletin, vol. 14, No. 10, Mar. 1972, pp. 2900-2901.
Lee et al., "Thin Film MOSFET's Fabricated in Laser-Annealed Polycrystalline Silicon", Applied Physics Letters, vol. 35, No. 2, Jul. 15, 1979, pp. 173-175.
Cuomo et al., "Polycrystalline Semiconductor Solar Cell," IBM Technical Disclosure Bulletin, vol. 17, No. 8, Jan. 1975, pp. 2455-2456.
Manoliu et al., "P-N Junctions in Polycrystalline-Silicon Films," Solid State Electronics, vol. 15, No. 10, Oct. 1972, pp. 1103-1106.

Primary Examiner—P. Ives
Attorney, Agent, or Firm—Antonelli, Terry & Wands

[57] ABSTRACT

A semiconductor device is disclosed wherein a polycrystalline film whose principal constituent is silicon is formed on an amorphous or polycrystalline substrate, the polycrystalline film having a carrier mobility of at least 1 cm$^2$/V·sec, and wherein at least one active device is formed by employing the polycrystalline film as its material. A large-area or elongate active device can be provided. The polycrystalline film for such semiconductor device is formed by a method wherein the amorphous or polycrystalline substrate is mounted in a vacuum chamber and wherein the polycrystalline film whose principal constituent is silicon is evaporated on the substrate under the conditions that the pressure during the evaporation is below $1 \times 10^{-8}$ Torr and that the partial pressure of oxygen during the evaporation is below $1 \times 10^{-9}$ Torr.

8 Claims, 13 Drawing Figures

SEMICONDUCTOR DEVICE AND METHOD OF MANUFACTURING THE SAME

BACKGROUND OF THE INVENTION

1. Field of the Invention

This invention relates to a semiconductor device which is formed on an amorphous or polycrystalline substrate.

2. Description of the Prior Art

By way of example, it has recently been attempted to elongate a linear photosensor array for reading a picture in a facsimile transmitter. Heretofore, silicon MOS and CCD (charge coupled device) type imaging sensors have been employed as the linear photosensor arrays. However, the sensor length is about 30 mm in the present situation, and the limitation of the sensor length which is technically realizable is approximately 125 mm. This is because the sensor length is determined by the size of a single-crystal silicon wafer which can be fabricated. Anyway, it is unavoidable to adopt a system wherein an image is scaled down with a lens optical system and then read by means of a sensor shorter than the width of an original (for example, 210 mm in the A4 format). In this case, the optical path length is as great as, for example, 200 mm, which is a major cause for hindering the miniaturization of the apparatus. Recently, to the end of miniaturizing the apparatus, the development of linear photosensor arrays of the close contact reading system has become serious. This is a system wherein a linear sensor of a length equal to the width of an original is realized by employing a thin film photodiode array of Se-As-Te chalcogenide glass, CdS or the like instead of the silicon sensor and wherein an image is read by holding the original and the sensor in close contact. This system has such merits (1) that since the lens optical system is not used, the miniaturization of the apparatus becomes possible, (2) that the adjustment of an optical system is easy, (3) that the problem of defocusing in the marginal part of a lens is not involved, and (4) that a high resolution is possible. Since, however, there is not any suitable elongate active device array, it is difficult to realize an elongate self-scanned photosensor in which a sensor portion and a scanner portion are made unitary. This fact is a serious hindrance to putting the elongate sensor of the close contact reading system into practical use. In order to realize the elongate self-scanned photosensor, the development of the elongate active device array suitable therefor is awaited.

As other examples, a liquid crystal display device and an electroluminescence display device have been developed as flat display panel to replace conventional cathode-ray tubes. There have already been made the trial manufacture of a display device combined with a thin film transistor array of CdSe or the like and the trial manufacture of a display device combined with a silicon scanner. In case of the former, there are such problems that the thin film transistor array free from defects cannot be realized and that the operating characteristics of thin film transistors are unstable. In case of the latter, since the size of the single-crystal silicon wafer which can be fabricated is limited, the maximum limit of the dimensions of the device is 75 mm × 75 mm in the present situation, resulting in the disadvantage that the device is too small in case of considering the application to a flat TV screen. Also to the end of applying the liquid crystal display device and the electroluminescence display device to the flat TV screen, the development of a suitable active device array of of large area is awaited.

SUMMARY OF THE INVENTION

A first object of this invention is to provide a semiconductor device which has good and stable operating characteristics and which makes it possible to fabricate a large-area or elongate active device array. Structurally, it is further intended to provide a semiconductor device which, at need, permits the incidence of light from either of a device side and a substrate side by selecting a substrate. Another object of this invention is to provide a method of manufacturing the semiconductor device.

To the accomplishment of the objects, the semiconductor device is so constructed that a polycrystalline film whose principal constituent is silicon is formed on an amorphous or polycrystalline substrate, the polycrystalline film having a carrier mobility of at least 1 $cm^2/V \cdot sec$, and that at least one active device is formed by employing the polycrystalline film as a material.

The polycrystalline film to be used for such semiconductor device is produced by a method wherein the amorphous or polycrystalline substrate is mounted within a vacuum chamber, and the polycrystalline film whose principal constituent is silicon is evaporated onto the substrate under the conditions that the degree of vacuum during the evaporation is less than $1 \times 10^{-8}$ Torr in terms of pressure and that the partial pressure of oxygen during the evaporation is less than $1 \times 10^{-9}$ Torr.

DETAILED DESCRIPTION OF THE PREFERRED EMBODIMENTS

Figure 1A:
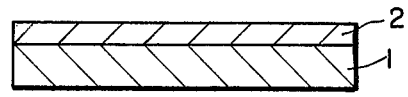
FIGS. 1a-1h are sectional views of a device for elucidating a process for explaining an embodiment of this invention.

In this invention, a system is adopted in which on an amorphous or polycrystalline substrate (for example, glass substrate or ceramics substrate of $Al_2O_3$ or the like), a polycrystalline silicon film is formed at a substrate temperature (for example, in case of the glass, a temperature lower than the softening point thereof) within the usable temperature range of the substrate and in which a semiconductor device is formed by employing the polycrystalline silicon film as a material. Here, the term "substrate" signifies one which has a physical strength by itself and which can support itself. In this invention, a transparent substrate or a non-transparent substrate is used as may be needed.

It is as previously stated that a single-crystal material cannot be employed for obtaining a large-area or elongate semiconductor device. In order to attain good operating characteristics, a material whose mobility is not lower than approximately 1 cm$^2$/V·sec needs to be employed, so that amorphous materials having low mobilities (about 0.08 cm$^2$/V·sec) are also unsuitable. It is accordingly necessary to use a polycrystalline material as the material of the device because it permits to render the area large and its carrier mobility is not lower than 1 cm$^2$/V·sec. Among polycrystalline materials, polycrystalline silicon is suited as the semiconductor material of this invention because of its merits that the physical and chemical properties are suitable for applications to semiconductor devices and that the techniques of the silicon semiconductor industry having been highly developed can be exploited as they are or through slight modifications.

Especially for the application to a picture device, a structure is desirable according to which the semiconductor device can be formed on a transparent substrate such as glass substrate at need. Heretofore, however, a process at a high temperature of at least 900° C. has been inevitably undergone in order to obtain a polycrystalline silicon film whose mobility at 300° K. is 1 cm$^2$/V·sec or above. By way of example, according to the low-temperature chemical vapor deposition, the mobility of a polycrystalline silicon film formed at a growth temperature of 880° C. is below 1 cm$^2$/V·sec. With the prior art, accordingly, it has been difficult to form the polycrystalline silicon film whose mobility is at least 1 cm$^2$/V·sec, not only on ordinary glass whose softening point is 630° C., but also on ultra-hard glass (first-class hard glass of JIS) whose softening point is 820° C.

This invention provides a method wherein evaporation is carried out in an ultra-high vacuum in which the degree of vacuum during the evaporation is lower than $1 \times 10^{-8}$ Torr in terms of pressure, whereby the polycrystalline silicon film whose mobility is at least 1 cm$^2$/V·sec is produced by the vacuum evaporation at a substrate temperature lower than the softening point of glass used. Especially, O$_2$ in a residual gas during the evaporation exerts evil effects on material characteristics, and hence, the partial pressure of oxygen is restrained to below $1 \times 10^{-9}$ Torr in this invention.

As the evaporation rate, a value of 1,000 Å/hour to 10,000 Å/hour is ordinarily employed. Preferably, a value of 1,000 Å/hour to 4,000 Å/hour is employed.

The subject of the evaporation rate chiefly concerns the technique of an evaporation source. When it is intended to raise the evaporation rate, the lowering of the degree of vacuum is liable to be simultaneously incurred. If the degree of vacuum can be held at a predetermined value, an evaporation rate of, for example, 50,000 Å or above may well be employed.

As the substrate temperature during the evaporation, a value of at least 400° C., more preferably at least 500° C. is employed. When the substrate temperature is below 400° C., any polycrystalline film of satisfactory characteristics cannot be obtained. By the manufacturing method as described above, the desired polycrystalline silicon film can be obtained.

The details of the reason why the polycrystalline silicon film of the desired high grade can be formed by such manufacturing method involve many unclear points, but are conjectured as follows. Residual gas molecules which come into collision with the surface of the substrate will be substantially negligible under the conditions in the present manufacturing method.

In order to fabricate the semiconductor device by working the polycrystalline silicon film, several stages of steps must be undergone. In this invention, heat-treatment temperatures in these steps are restrained to be lower than 820° C. which is the softening point of the ultra-hard glass. In case of employing a glass substrate of low softening point, the heat-treatment temperatures can also be restrained still lower, for example, 550° C. or below. Hereunder a MOS field-effect transistor (abbreviated to "MOSFET") will be referred to as an example of the semiconductor device.

In order to obtain a gate insulator, the thermal oxidation of a silicon substrate is usually relied on. Since, however, the thermal oxidation requires a high temperature of or above 1,000° C., it is not usable for the purpose here. An SiO$_2$ film is therefore formed by the chemical vapor deposition by means of an expedient wherein SiH$_4$ and O$_2$ are caused to react at a temperature of at least 300° C. and at most 500° C., or an expedient wherein SiH$_4$ and NO$_2$ are caused to react at a temperature of at least 400° C. and at most 800° C. The SiO$_2$ film thus obtained by the chemical vapor deposition is employed as the gate insulator. Heretofore, the SiO$_2$ film obtained by the chemical vapor deposition has been employed for passivation, and there has not been any example employed as the gate insulator.

Heretofore, to the end of forming a source region and a drain region, an expedient of forming p$^+$ layers or n$^+$ layers by the thermal diffusion has been ordinarily performed. Since, however, this expedient requires a heat treatment at approximately 1,150° C., it is not usable for the purpose here. This invention employs an expedient in which, in place of the thermal diffusion, the ion implantation is used to form the p$^+$ layers or n$^+$ layers. After the ion implantation, annealing is carried out for electrical activation. In this case, the annealing temperature needs to be made lower than the softening point of the substrate used. This invention therefore adopts such an expedient wherein ions, for example, BF$_2^+$ which can be highly activated by the annealing at a low temperature of approximately 550° C. are implanted or wherein after implanting, for example, B$^+$ ions, the annealing is performed at a temperature of approximately 500° C.–600° C. immediately before the reverse annealing phenomenon takes place. In cases of P$^+$ ions, As$^+$ ions etc., the reverse annealing phenomena are not so remarkable as in the case of B$^+$ ions, but the former ions can be sufficiently activated by the annealing at approximately 500° C.–600° C. Accordingly, both the p$^+$ layers and the n$^+$ layers can be formed by the low-temperature step at approximately 500° C.–600° C. It is a matter of course that the annealing may well be performed at a temperature of 800° C. in case of employing a substrate such as the ultra-hard glass whose softening point is higher than 800° C.

Hereunder, this invention will be described in detail with reference to embodiments.

EMBODIMENT 1

An embodiment in the case where a polycrystalline silicon film is formed on a glass substrate and where a p-channel MOS field-effect transistor is fabricated in the polycrystalline silicon will be described in conjunction with sectional views for explaining the steps of manufacture as shown in FIGS. 1a–1h.

Figure 1B:
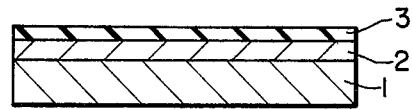
Figure 1C:
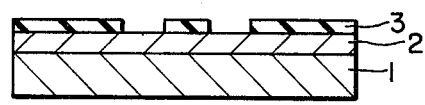
Figure 1D:
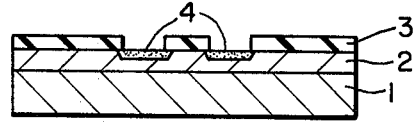
Figure 1E:
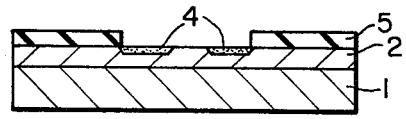
Figure 1F:
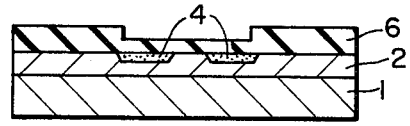
Figure 1G:
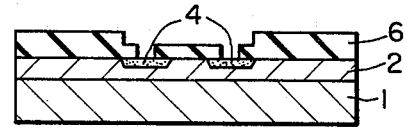
Figure 1H:
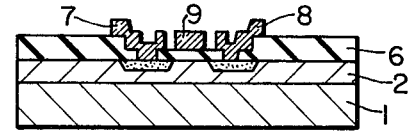

First, a substrate is installed within a vacuum evaporation apparatus attainable to an ultra-high vacuum. The apparatus may be a conventional one. On the substrate 1 of ordinary hard glass (second-class hard glass of JIS), a silicon film 2 is deposited to a thickness of 6,000 Å by performing the vacuum evaporation under the conditions of a substrate temperature of 550° C., a degree of vacuum during-the-evaporation of $9 \times 10^{-9}$ Torr, a partial pressure of oxygen during-the-evaporation of $1 \times 10^{-10}$ Torr and an evaporation rate of 3,000 Å/hour (FIG. 1a). The silicon film 2 formed is polycrystalline silicon of the n-type, and has a mobility greater than 1 cm$^2$/V·sec. Subsequently, an SiO$_2$ film 3 is deposited to a thickness of 5,000 Å at a substrate temperature of 415° C. by the chemical vapor deposition (FIG. 1b). As shown in FIG. 1c, this SiO$_2$ film is provided with windows for source and drain regions. Subsequently, BF$_2$+ ions at an energy of 150 KeV are implanted at a dose of $3 \times 10^{15}$/cm$^2$, and the resultant substrate is annealed at 550° C. for 100 minutes, whereby p+ layers 4 are formed in the source and drain regions (FIG. 1d). At the next step, as shown in FIG. 1e, the SiO$_2$ is removed with a field oxide 5 left behind. An SiO$_2$ film 6 is deposited for a gate insulator to a thickness of 2,000 Å by the chemical vapor deposition again (FIG. 1f). Further, holes for electrode contacts are provided as shown in FIG. 1g by the photoetching process. After evaporating Al on the whole surface of the resultant substrate, the Al is worked by the photoetching process so as to form a source electrode 7, a drain electrode 8 and a gate electrode 9 (FIG. 1h). Thereafter, the resultant substrate is annealed at 400° C. in an atmosphere of H$_2$ for 30 minutes. By the above steps, a MOS field-effect transistor was fabricated in the polycrystalline silicon. This semiconductor device exhibited good and stable characteristics as the transistor.

Figure 2:
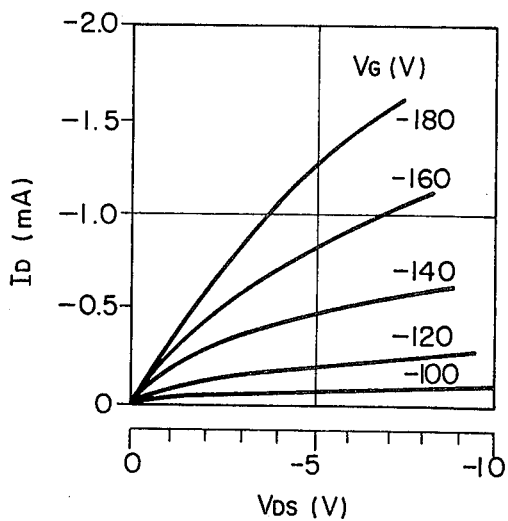
FIG. 2 is a graph showing the drain current-versus-drain voltage characteristics of a field-effect transistor of this invention.

FIG. 2 illustrates examples of the characteristics of MOSFETs which were manufactured by way of trial. The characteristics are drain current $I_D$-versus-drain voltage $V_{DS}$ characteristics with the gate voltage $V_G$ being a parameter. In the example of the characteristics, the threshold voltage is made as great as 80 V by rendering the thickness of the SiO$_2$ film as great as 7,000 Å. This MOSFET can be employed for a driving circuit of electroluminescence display device.

Here, the common hard glass whose softening point is 780° C. was employed as the substrate glass. Since no annealing is carried out at a temperature higher than 550° C. throughout the process, the glass substrate does not soften. The ordinary glass (soda glass) whose softening point is 630° C. and which is inexpensive, the ultra-hard glass whose softening point is 820° C., or quartz glass whose softening point is 1,500° C. can be similarly employed for the substrate because the substrate does not soften. From the viewpoint of practicability, it is also important that the manufacturing cost of a semiconductor device is low. The use of the inexpensive ordinary glass or the like as the substrate is the most advantageous in this respect, the use of the common hard glass, the ultra-hard glass or the like is subsequently advantageous, and the use of the quartz glass or the like being expensive is disadvantageous. According to this invention, it also becomes possible to fabricate a semiconductor device by the use of the inexpensive glass substrate of low softening point.

Regarding the transparency of the substrate glass, it is possible to employ any of the conventional transparent glass, filter glass which transmits only light of wavelengths in a certain range, and non-transparent glass.

In the step of forming the polycrystalline silicon film and other various steps, any technical problem which hinders making the semiconductor device large in area or elongate is not involved in the manufacturing method. By employing the transparent substrate at need, also the incidence of light from the substrate side becomes possible.

As stated above, according to this invention, it can be realized readily and inexpensively to form on the glass substrate the large-area or elongate semiconductor device having the good and stable operating characteristics. In case of necessity, the structure in which light is caused to enter from the substrate side is also possible.

Although, in the above, the case of employing the glass substrate has been stated, ceramics substrates of Al$_2$O$_3$ etc. can also be employed.

In the foregoing embodiment, the polycrystalline silicon film serving as the material of the device has not been intentionally doped with any impurity. However, a p-type impurity or n-type impurity can be intentionally added in such a way that during the evaporation of silicon, a very small amount of Ga, Sb or the like is simultaneously evaporated. It is of course possible to control the concentration of the impurity.

A MOS field-effect transistor which can be driven by supplying low driving voltage (about $V_G$=several voltage) to the gate is, of course, fabricated in the polycrystalline silicon. A p-type polycrystalline silicon film is formed on a glass substrate in such a way that during the evaporation of silicon, small amount of Ga is simultaneously evaporated. A n-channel MOSFET of depletion type is fabricated in the p-type polycrystalline silicon. Fundamental processes of manufacturing a MOS field effect transistor is the same as the foregoing embodiment. P+ ions at an energy of 100 KeV are implanted at a dose of $1 \times 10^{16}$/cm$^2$ and resultant substrate is annealed at 600° C., whereby n+ layers are formed in the source and drain regions. The thickness of the SiO$_2$ film is 2000 Å.

The threshold voltage of this MOSFET is about $-25$ V and can be driven by supplying low driving voltage.

Now, a linear self-scanned photosensor in which a photodiode and an integrated circuit for scanning are made unitary will be described as an example of application.

Figure 3:
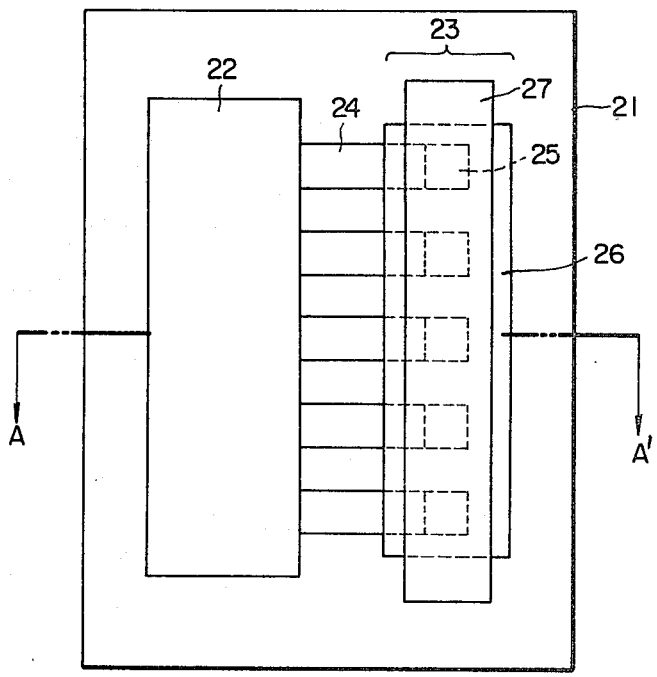
FIGS. 3 and 4 are a plan view and a sectional view showing an example in which this invention is applied to a photoelectric converter.
Figure 4:
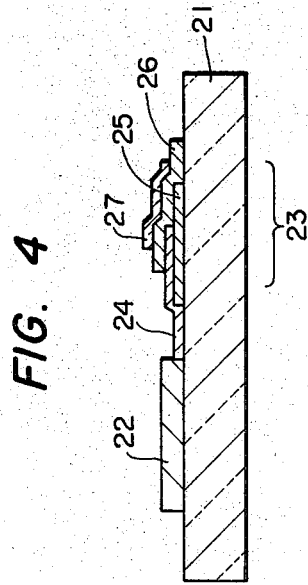
Figure 5:
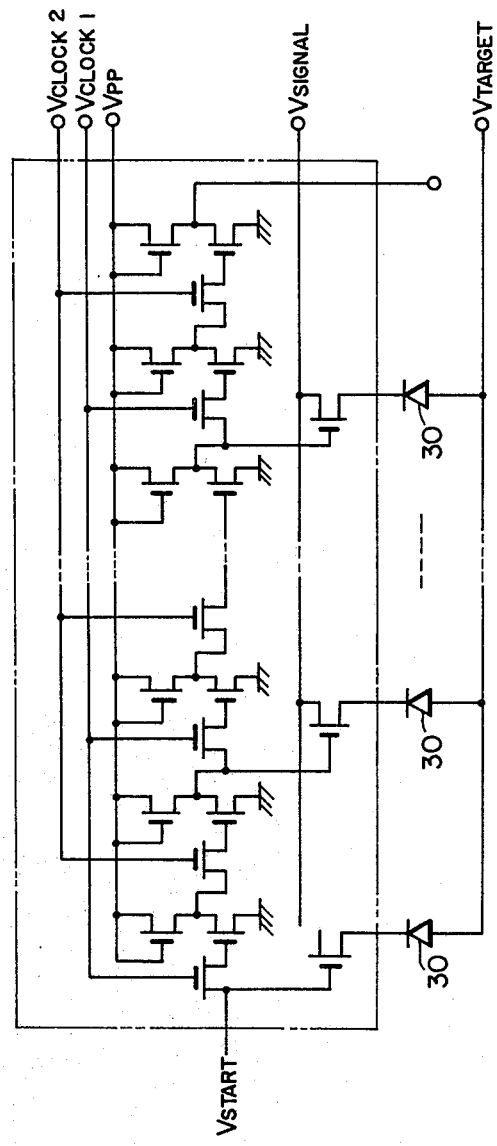
FIG. 5 is a diagram showing an example of a circuit which is employed for the example of the photoelectric converter.

FIG. 3 is a plan view of the photosensor, while FIG. 4 is a sectional view taken along A-A' in the plan view. Numeral 21 designates a transparent glass substrate, on which a scanning IC portion 22 constructed of MOSFETs is formed by the method stated in Embodiment 1. FIG. 5 shows an example of the circuit arrangement of the device. A part enclosed with a broken line in FIG. 5 is the example of the scanning IC portion, and numeral 30 indicates photosensors. Numeral 23 in FIG. 4 indicates a photosensor portion. The photosensor portion 23 is constructed as follows. A transparent electrode 25 is disposed in the shape of a strip on the glass substrate 21 by the use of, for example, SnO$_2$ and is overlaid with a lower electrode 24 for the photosensor by the use of a metal such as Cr. Of course, a part of the transparent electrode 25 is not provided with the Cr film and serves as a light transmitting window. The lower electrode 24 is connected to a predetermined part of the scanning IC portion 22. A photoconductive film 26, for example, Se-As-Te-based amorphous semiconductor film is formed on the lower electrode 24, and is overlaid with a common upper electrode 27 in the shape of a strip. The photoconductive film can be readily formed by the evaporation.

In case of employing a nesa film for the transparent electrode, a nesa transparent conductive film is first formed on the substrate. Subsequently, an interconnection to the scanning IC is formed, whereupon the scanning IC portion is formed in alignment therewith. The manufacturing method is as stated before. After finishing the scanning IC, the photoconductor film 26 and the upper metal electrode 27 are formed by the evaporation, whereby the self-scanned photosensor is finished up.

This device is useful when used in order to convert picture information on a flat picture recording member into time-sequential electric signals as a photoelectric converter of a facsimile transmitter, an OCR or the like.

EMBODIMENT 2

Figure 6:
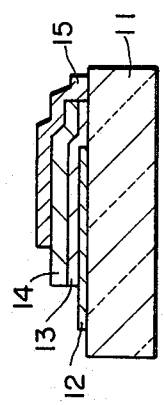
FIG. 6 is a sectional view showing another embodiment of this invention.

An example in which this invention is applied to a p-n junction diode will be described. FIG. 6 is a sectional view of the device.

A transparent glass substrate 11 is prepared, on which a Cr film is evaporated to about 2,000 Å. The Cr film is evaporated at a substrate temperature of 200° C. Using the conventional photoetching, the Cr film is worked in a desired shape into an electrode 12. The resultant substrate is mounted in a vacuum evaporation apparatus, and in an atmosphere in which the degree of vacuum is $8 \times 10^{-9}$ Torr, Ga and Si are simultaneously evaporated so as to form a polycrystalline silicon film (p-type) 13 which is 1 μm thick and which contains Ga at $2 \times 10^{17}/cm^3$. The substrate temperature is made 550° C. Subsequently, in the same atmosphere as stated above, Sb and Si are simultaneously evaporated so as to form a polycrystalline silicon film (n-type) 14 which is 1 μm thick and which contains Sb at $3 \times 10^{17}/cm^3$. The substrate temperature is made 550° C. The elements Ga and Sb are introduced in order to bring the silicon into the p-type and the n-type respectively, and may be to the extents that they are usually introduced in order to form an n-p junction. Further, Al is evaporated on these stacked layers. The substrate temperature at this time is 200° C. The Al layer is worked into an electrode 15 in a desired shape by the well-known photoetching.

Thus, the p-n junction diode is finished up.

All the above steps are performed by low-temperature processes at or below 550° C. As stated in Embodiment 1, according to this invention, it can be realized readily and inexpensively to form the large-area or elongate p-n junction diode array.

In the example thus far described, the diode array having merely the p-n junction has been referred to. Needless to say, however, it is possible with the method of this invention to form a p-n-p bipolar transistor and an n-p-n bipolar transistor on the glass substrates etc. It is also possible to form an integrated circuit by combining two or more semiconductor devices in such a way that the isolation between the devices is made by the use of an SiO₂ film formed by the low-temperature chemical vapor deposition.

What is claimed is:

1. A method of manufacturing a semiconductor device comprising the steps of mounting an amorphous or polycrystalline substrate in a vacuum chamber, and evaporating a polycrystalline silicon film onto said substrate under conditions that the pressure during the evaporation is below $1 \times 10^{-8}$ Torr and that a partial pressure of oxygen during the evaporation is below $1 \times 10^{-9}$ Torr, and forming at least one semiconductor device employing said polycrystalline silicon film.

2. A method of manufacturing a semiconductor device as defined in claim 1, wherein a substrate temperature during the evaporation of said polycrystalline silicon film is at least 400° C.

3. A method of manufacturing a semiconductor device as defined in claim 1, wherein an impurity selected from the group consisting of p-type impurity and n-type impurity is simultaneously evaporated onto said substrate with said polycrystalline silicon film.

4. A method of manufacturing a semiconductor device as defined in claim 1 or 2, wherein said substrate has a softening point below 820° C.

5. A method of manufacturing a semiconductor device as defined in claim 1 or 2, wherein the polycrystalline silicon film is evaporated onto said substrate at a rate of 1,000–10,000 Å/hour.

6. A method of manufacturing a semiconductor device as defined in claim 1 or 2, wherein said at least one semiconductor device is formed by selectively forming an SiO₂ gate insulator layer on said polycrystalline silicon film, forming source and drain regions in said polycrystalline silicon film by ion implantation, and forming source, gate and drain electrodes.

7. A method of manufacturing a semiconductor device as defined in claim 6, wherein the SiO₂ gate insulator layer is formed by chemical vapor deposition.

8. A method of manufacturing a semiconductor device as defined in claim 1 or 2, wherein a conductive material is deposited on said substrate, said polycrystalline silicon film is evaporated to be directly in contact with said conductive material, said polycrystalline silicon film being of one conductivity type, a second polycrystalline silicon film of the opposite conductivity type to said one conductivity type is deposited directly on said polycrystalline silicon film, said second polycrystalline film being deposited by evaporation deposition under conditions that the pressure during the evaporation is below $1 \times 10^{-8}$ Torr and that a partial pressure of oxygen during the evaporation is below $1 \times 10^{-9}$ Torr, and a second conductive layer is formed directly in contact with said second polycrystalline film.

* * * * *